United States Patent [19]

Anderle et al.

[11] Patent Number: 4,886,592
[45] Date of Patent: Dec. 12, 1989

[54] APPARATUS ON THE CAROUSEL PRINCIPLE FOR COATING SUBSTRATES

[75] Inventors: Friedrich Anderle, Hanau am Main; Dan L. Costescu, Hainburg; Stefan Kempf, Alzenau; Emmerich Novak, Obertshausen; Jaroslav Zejda, Rodenbach, all of Fed. Rep. of Germany

[73] Assignee: Leybold Aktiengesellschaft, Cologne, Fed. Rep. of Germany

[21] Appl. No.: 196,724

[22] Filed: May 20, 1988

[30] Foreign Application Priority Data

Oct. 17, 1987 [DE] Fed. Rep. of Germany ....... 3735284

[51] Int. Cl.$^4$ ............................................. C23C 14/56
[52] U.S. Cl. .................................... 204/298; 118/719; 118/721; 118/730; 414/221; 414/223
[58] Field of Search ............... 204/298 MC, 298 EM, 204/298 MS; 118/719, 721, 730; 414/222–223, 225, 217, 221

[56] References Cited

U.S. PATENT DOCUMENTS 4,733,631 3/1988 Boyarsky et al. .................... 118/719
4,808,291 2/1989 Denton et al. ....................... 204/298

FOREIGN PATENT DOCUMENTS 0136562 4/1985 European Pat. Off. ............ 204/298

Primary Examiner—Aaron Weisstuch
Attorney, Agent, or Firm—Felfe & Lynch

[57] ABSTRACT

A rotatable substrate holder (6) which has a plurality of substrate pickups in a circular arrangement at equal distances apart is disposed in a vacuum chamber (1). A corresponding number of substrates are driven stepwise on a circular path from an air lock station (8, 9) through at least one coating station (10, 11) to the air lock station. To increase the throughput of substrates, the vacuum chamber (1) has two air lock stations (8, 9) and two coating stations (10, 11) one following the other. The step size of the drive (36) on the one hand, and the angular position of each coating station (10 and 11, respectively) with respect to the air lock station associated with it (8 and 9, respectively) with reference to the axis of rotation of the substrate holder (6) on the other hand, are selected such that one and the same coating station (10 and 11, respectively), through the step-wise movement of a particular substrate pickup (63), is associated in each case with one and the same air lock station (8 and 9, respectively).

14 Claims, 6 Drawing Sheets

4,886,592

APPARATUS ON THE CAROUSEL PRINCIPLE FOR COATING SUBSTRATES

BACKGROUND OF THE INVENTION

The invention relates to an apparatus on the carousel principle for coating substrates, having a vacuum chamber and a rotatable substrate holder disposed in the latter. The apparatus has a plurality of substrate pickups in a circular arrangement at equal distances apart, and by which a corresponding number of substrates are transportable step-wise by means of a drive, on a circular path from an air lock station through at least one coating station to the air lock station.

The manner of operation of such an apparatus can be considered to be quasi-continuous on account of the stoppage between the individual steps, necessitated by the entrances and exits through the locks as well as by the stationary coating process.

U.S. Pat. No. 3,652,444 has disclosed an apparatus of the kind described above, which has three coating stations but only one air lock station. The known apparatus is intended for the production of semiconductors, and usually the various coating stations serve in this case for the application of a whole series of coatings. The coating stations can be preceded and followed by other treatment stations in which other treatment processes are performed, as necessary for the pre-treatment and post-treatment of semiconductors. For a given pitch diameter and corresponding investment costs, however, the throughput is limited, if only because entering and leaving the air locks including the evacuation of the air lock chamber require a suitable length of time.

There are a number of coating tasks and products in which the coating process itself and/or the pre-treatments and/or post-treatments call for a lesser expenditure of time, so that the use of the known apparatus for such processes or products would be extremely uneconomical. An example of such products is the so-called CD record which is to be provided on only one side with a single coat of a quickly applied highly reflective metal such as aluminum, for example.

Also important in the operation of such apparatus are the so-called loading stations with which the all-automatic loading and unloading of such apparatus is possible. Such loading stations in conjunction with their corresponding magazine stations are relatively complex and their cycling frequency cannot be fully utilized on account of the relatively slow manner of operation of the known apparatus.

The invention is therefore based on the task of improving an apparatus of the kind described above such that the throughput can be substantially increased at approximately comparable investment costs.

SUMMARY OF THE INVENTION

The vacuum chamber has two air lock stations and two coating stations, one following the other, circumferentially of the rotatable substrate holder. The step magnitude of the drive on the one hand, and the angular position of each coating station with respect to the air lock station associated with it in relation to the axis of rotation of the substrate holder, on the other hand, are such that one and the same coating station is associated, through the step-wise movement of a particular substrate pickup, with one and the same air lock station.

In principle it is brought about by the double arrangement of air lock stations and coating stations that two series of substrates are transported in alternating order through the apparatus, but two substrates are coated simultaneously, i.e., in parallel operation, and the air lock stations are operated simultaneously, i.e., in parallel operation, namely during the stoppage of the substrate holder between two transport steps. Such an apparatus and its manner of operation consequently permit virtually a doubling of the throughput at only slightly higher investment costs, due to the double arrangement of air lock and coating stations.

At the same time it is quite especially advantageous toward simplifying the control of such an apparatus if the substrates coated in the foremost coating station in the direction of transport can enter and leave through the air lock station that is also foremost in the transport direction, and the substrates coated in the hindermost coating station in the direction of transport can enter and leave through the hindermost lock station.

The interrelationship of air lock stations on the one hand and of the coating stations on the other in accordance with the invention is accomplished by varying the step length of the drive on the one hand and the angle of distribution of the substrate pickups on the other. In case of the doubling of the coating stations and air lock stations, therefore, it will be best to proceed such that the step length of the drive is twice as great as the angle of distribution of the substrates.

In a quite especially desirable manner, the substrate holder acting as a carousel, is provided with a total of twenty-four substrate pickups, so that the dividing angle amounts to 15 degrees. The step of the drive consequently will be 30 degrees of angle. In such a case the distance between the air lock stations can advantageously be 45 degrees of angle and the distance between the coating stations can be 75 degrees of angle. The greater distance between the coating stations is to be attributed to the fact that the latter as a rule have a greater diameter.

The division of the substrates contained in an uninterrupted series in the substrate holder into two alternating series of substrates which enter and leave through the air locks in the different air lock stations on the one hand, and are coated in the different coating stations on the other, is performed in the manner described.

The air lock stations may have a lock chamber upper part which is movable vertically while sealed off from the vacuum chamber and has a cylindrical inner chamber and a horizontal upper and lower sealing surface, plus a driven displacing body associated with the upper part and largely filling its interior, with a revolving sealing margin situated on its upper edge, which can be placed, when lowered, upon the upper sealing surface of the upper part, while the bottom sealing surface of the upper part can then be settled sealingly on the top of the substrate holder. An air lock chamber bottom part which can be moved while sealed off from the vacuum chamber and is coaxial with the upper part, and has an upper sealing surface which can be pressed sealingly against the bottom of the substrate holder such that, when the displacing body is lifted away the space between the substrate holder and the vacuum chamber is sealed off from the ambient air. When the displacing body is lowered and the air lock chamber evacuated, the substrate holder is freely movable with respect to the top part and bottom part sealing surfaces.

Of very special advantage in this case is the displacing body which merely by its penetration into the upper part of the air lock chamber largely displaces the ambient air there present and thus drastically reduces the evacuation time. The control function for the movement of the lock chamber upper part with its sealing surface against the substrate holder is brought about by a separate drive for the upper part of the air lock chamber, which is disposed between the flange and the vacuum chamber.

Still another particularly advantageous further development of the invention is characterized by the fact that the coating station has a cathode chamber disposed on the vacuum chamber with a sputtering cathode with a target whose sputtering surface (in a manner known initself) is facing the substrate holder, that between the target and the substrate holder a mask holder with a mask is disposed, and that underneath the vacuum chamber a lifting means with a lifting rod passing sealingly through the chamber floor is disposed, by which the substrate can be pressed concentrically against the mask by means of the substrate pickup.

DETAILED DESCRIPTION OF THE PREFERRED EMBODIMENT

Figure 1:
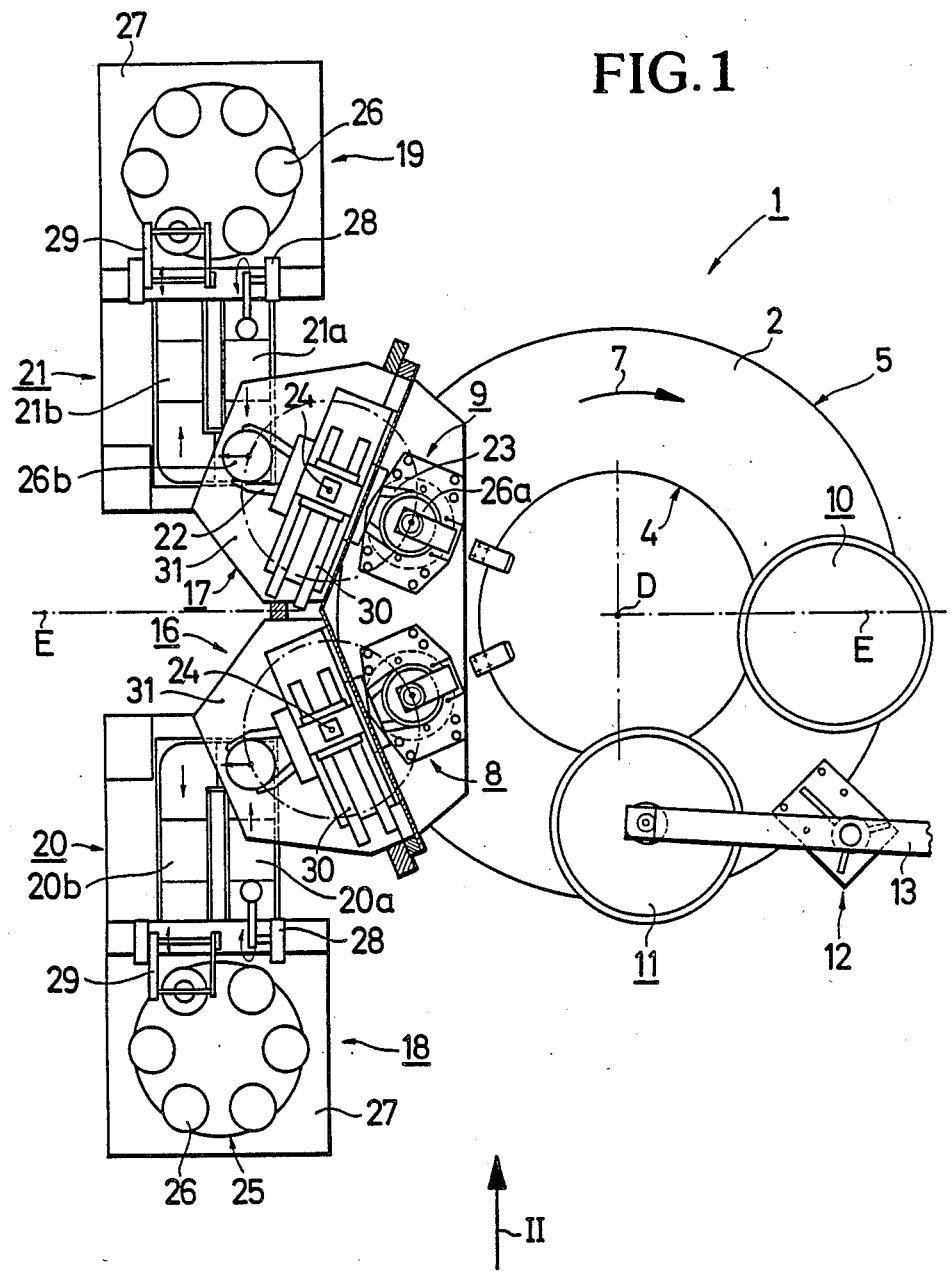
FIG. 1 is a top plan view of a complete apparatus according to the invention.
Figure 2:
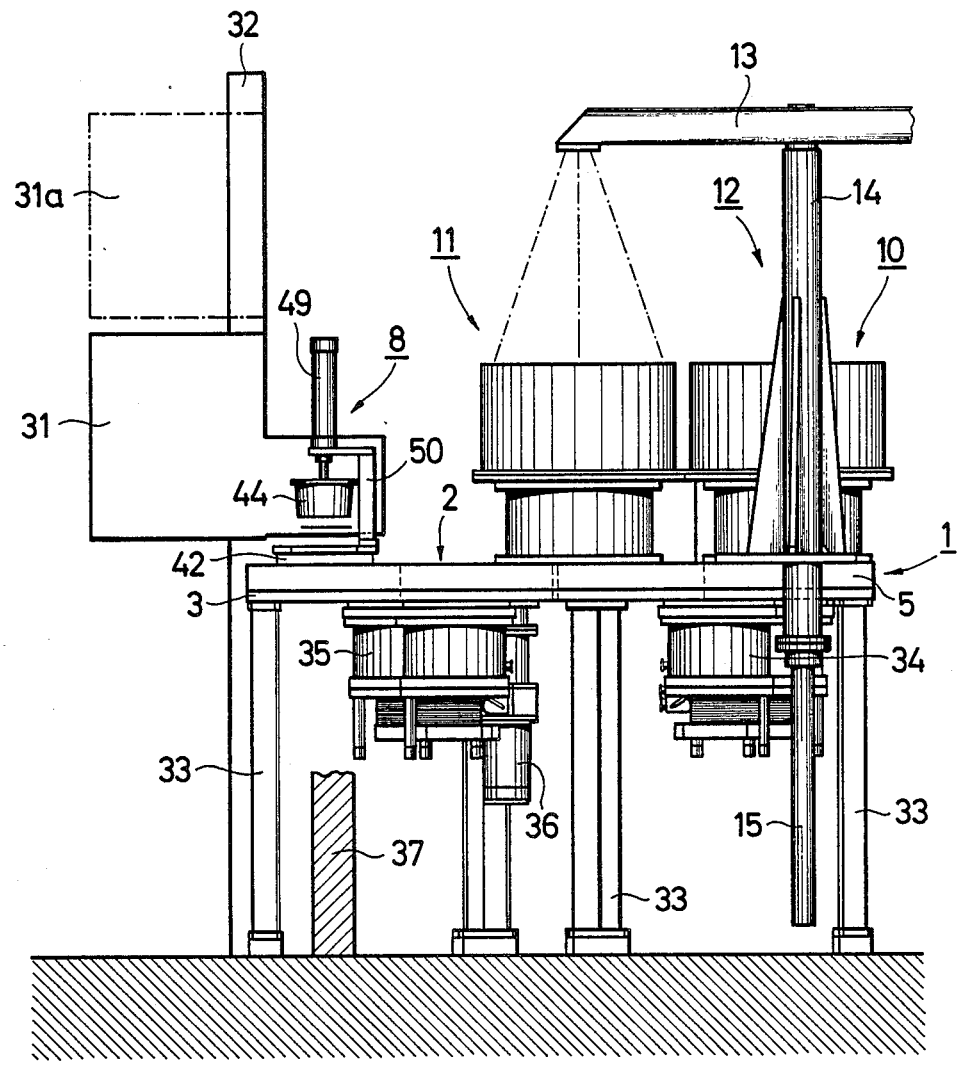
FIG. 2 is a front elevation of the subject of FIG. 1 seen in the direction of the arrow II.

FIGS. 1 and 2 show a vacuum chamber 1 whose outer envelope can be described as formed by a low, hollow cylinder, i.e., an upper annular chamber roof 2 and a congruent annular chamber floor 3 are joined together by a inner ring 4 and an outer ring 5. The very shallow dimensions of the vacuum chamber 1 can be seen especially in FIG. 2. In the interior of the vacuum chamber 1 there is housed a likewise annular substrate holder 6 (FIG. 3) which is rotatable and driven, which will be discussed further in connection with FIGS. 3 to 7. The arrangement, however, does not have to correspond to an annular ring in plan, and instead the vacuum chamber can also be of a cylindrical configuration.

The direction of transport of the substrates is indicated by the arrow 7.

The vacuum chamber 1 is equipped with two identical air lock stations 8 and 9 which will be discussed in detail in connection with FIGS. 4 to 6.

With the coating stations 10 and 11 there is associated a lifting mechanism 12 which consists of a swinging boom 13, a guiding tube 14 and a jack 15 and is intended to permit an exchange of the cathodes.

It is to be understood that the angle of division that is given refers in each case to the vertical central axes of the air lock stations and of the coating stations as well as those of the substrate pickups and substrates.

As it can be seen especially in the plan view in FIG. 1, a loading station 16 and 17 and a magazine station 18 and 19 are associated with the air lock stations 18 and 19, respectively. Between each loading station and each magazine station there is disposed a transfer system 20 and 21, with two parallel, one-track transport paths 20a/20b and 21a/21b, respectively.

Each loading station has two grippers 22 and 23, which are fastened in diametrically opposite directions to a common rotational shaft 24. The shaft 24 is situated in such a position in relation to the transfer system 20 and 21 on the one hand and to the air lock station 8 and 9, respectively, on the other, that, by means of the one gripper 23 a substrate 26a situated over the air lock station 8 or 9 can be selectively picked up or dropped, and by means of the other gripper 22 a substrate 26b situated over the transfer system can be selectively picked up or dropped.

Each magazine station 18 and 19 has a magazine 25 in the form of a revolving turret in which six stacks of substrates 26 are contained. Each magazine is in turn contained in a magazine table 27. The magazine stations 18 and 19 also include an inverting device 28 and a depositing device 29.

In regard to the rotatory movement of the grippers 22 and 23, two shock dampers 30 are associated with their rotational shaft 24. The loading stations 16 and 17 are surrounded by guards 31 and the entire system is configured in a mirror-image symmetrical arrangement with respect to a vertical plane of symmetry E—E (FIG. 1).

As it can additionally be seen in FIG. 2, the guards 31 can be raised out of the position represented in solid lines to the position 31a represented in broken lines, to permit access to the loading station. The vacuum chamber 1 rests on supports 33. Turbomolecular pumps 34 and 35 are connected to the vacuum chamber 1, and a motor 36 is provided for the step-wise driving of the substrate holder 6 shown in FIG. 7.

The section of wall 37 symbolically represents the boundary wall of a clean room.

Figure 3:
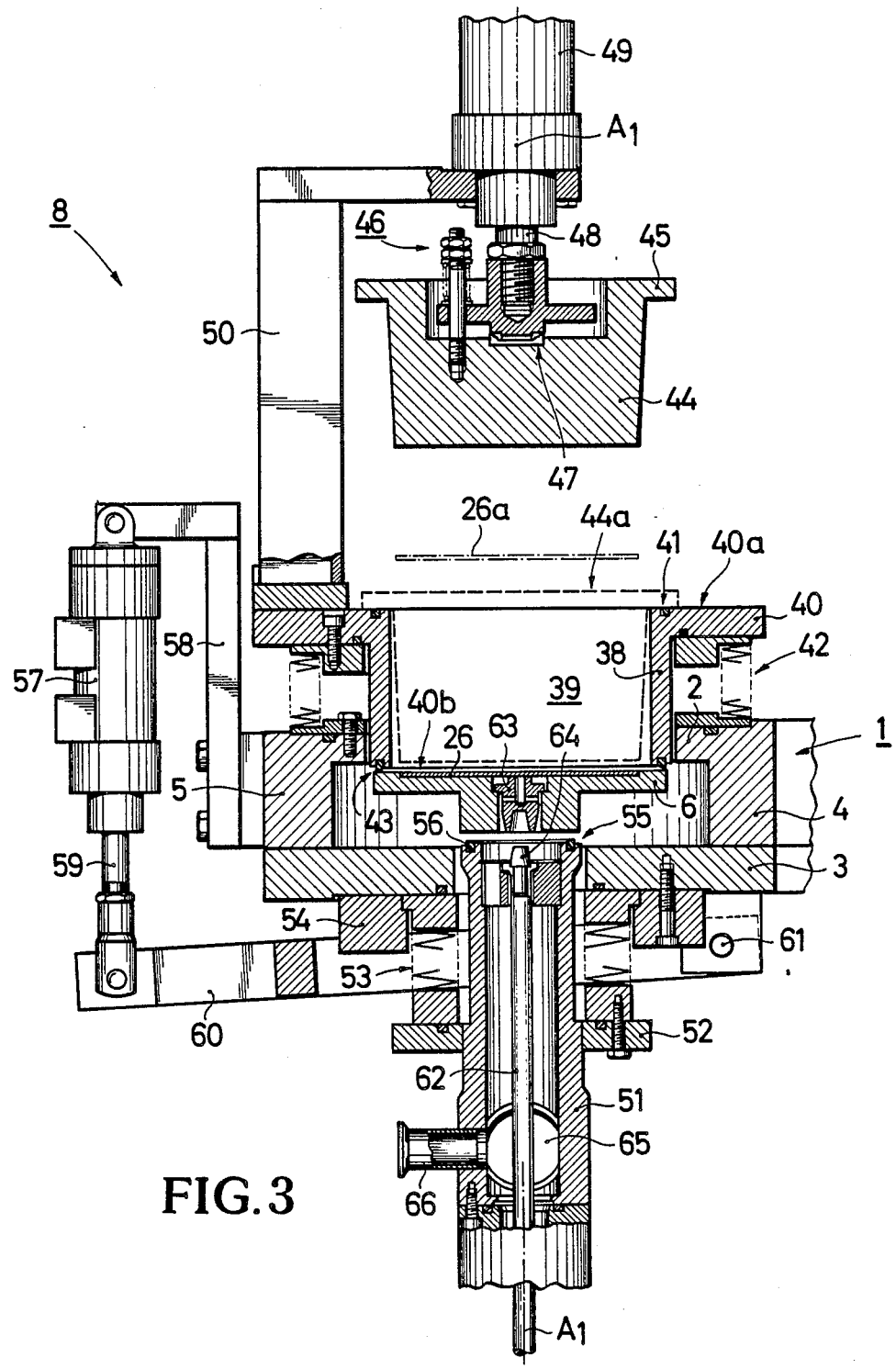
FIG. 3 is an enlarged vertical section through one of the air lock stations.

Details of the vacuum chamber 1 are more clearly seen in FIG. 3, namely the chamber roof 2, the chamber floor 3 and the rings 4 and 5. In the chamber roof 2 there is disposed a cylindrical opening which is penetrated with sufficient radial clearance by an air lock chamber upper part 38. The latter has a cylindrical inner chamber 39 and has at the upper end a flange 40 with a sealing surface 40a into which a sealing ring 41 is laid. The upper part 38 is connected in a vacuum-tight manner to the vacuum chamber 1 through a bellows 42.

The air lock chamber upper part 38 also has a bottom sealing surface 40b into which an additional sealing ring 43 is laid.

Also part of each of the air lock stations 8 and 9 is a displacing body 44 with a sealing flange 45, which is associated with the air lock chamber upper part 38, and is driven and largely fills the cylindrical inner chamber 39. The displacing body 44 is joined through an adjuster 46 and a swivel joint 47 to a plunger 48 belonging to a driving cylinder 49. The latter is in turn joined through a pillar 50 to the flange 40 thereby assuring a perfect centering of the displacing body 44 on the axis $A_1$—$A_1$ of the whole air lock station. By means of the driving cylinder 49 the flange 45 can be placed in a vacuum-tight manner onto the upper sealing surface 40a and the sealing ring 41 of the upper part of the air lock chamber.

Between the flange 40 and the vacuum chamber 1 there is also present a drive which is not visible here, by which the bottom sealing surface 40b of the upper part 38 is laid sealingly on the top of the substrate holder 6.

Furthermore, each air lock station 8 and 9 has an air lock chamber bottom part 51 which is in the form of a hollow tubular body and has a flange 52 for fastening an additional bellows 53 which concentrically surrounds the bottom part 51 and connects it in a vacuum-tight manner to the chamber floor 3. A screw collar ring 54 serves for the connection to the chamber floor.

The bottom part 51 has an upper sealing surface 55 into which a sealing ring 56 is likewise laid. With the interposition of the bellows 53, the bottom part 51 is brought through the chamber floor 3 so as to have limited movement in the direction of the axis $A_1$—$A_1$. The coaxial vertical movement is brought about by a driving cylinder 57 which is fastened through a supporting column 58 to the vacuum chamber 1 and whose plunger 59 acts on the one end of a forked lever 60 whose other end is connected by a pivot 61 to the chamber floor 3. Between the point of engagement of the plunger 59 and the pivot 61 the lever 60 is connected by an additional linkage, not represented here, to the bottom part 51 of the air lock chamber, so that when the driving cylinder 57 is actuated the bottom part 51 can be raised or lowered.

Inside of the air lock chamber bottom part 51 is contained a lifting rod 62 coaxial therewith, which can be raised upwardly and brought into engagement with a substrate pickup 63 which engages a concentric hole in the substrate 26. By means of the lifting rod 62 and the substrate pickup 63 the substrate can be moved between the position 26 represented in solid lines and position 26a represented in dash-dotted lines. In the first position named, the substrate 26 rests in a shallow cylindrical recess in the substrate holder 6, while the substrate pickup 63 rests with a flange, not further identified, on a likewise not further identified shoulder of the substrate holder 6. In this position the substrate 26 can be transported step-wise through the vacuum chamber 1. The joining of the lifting rod 62 to the substrate pickup 63 is performed when the lifting rod 62 is raised by means of a centering taper 64 which engages a complementary bore in the substrate pickup 63. The upper position 26a of the substrate is the position in which the substrate can be turned to the axis $A_1$—$A_1$ and turned away from it again by means of the grippers 22 or 23 (see FIG. 1).

The air lock chamber bottom part 51 is connected to a vacuum pump by a suction connection 65 and can be vented through a flooding line 66.

Regarding FIG. 3, it should be added that the represented positions of the displacing body 44 on the one hand and of the air lock chamber upper part 38 and bottom part 51 on the other do not occur simultaneously during operation. The represented position of upper part 38 and bottom part 51 relative to the substrate holder 6 is possible only when the displacing body is in the position indicated by broken lines, i.e., sealed against the upper part 38. Conversely, when the displacing body 44 is in the raised position, the sealing surfaces 40b and 55 must be in contact with the substrate holder 6 in order to prevent the entry of ambient air into the vacuum chamber 1.

Figure 4:
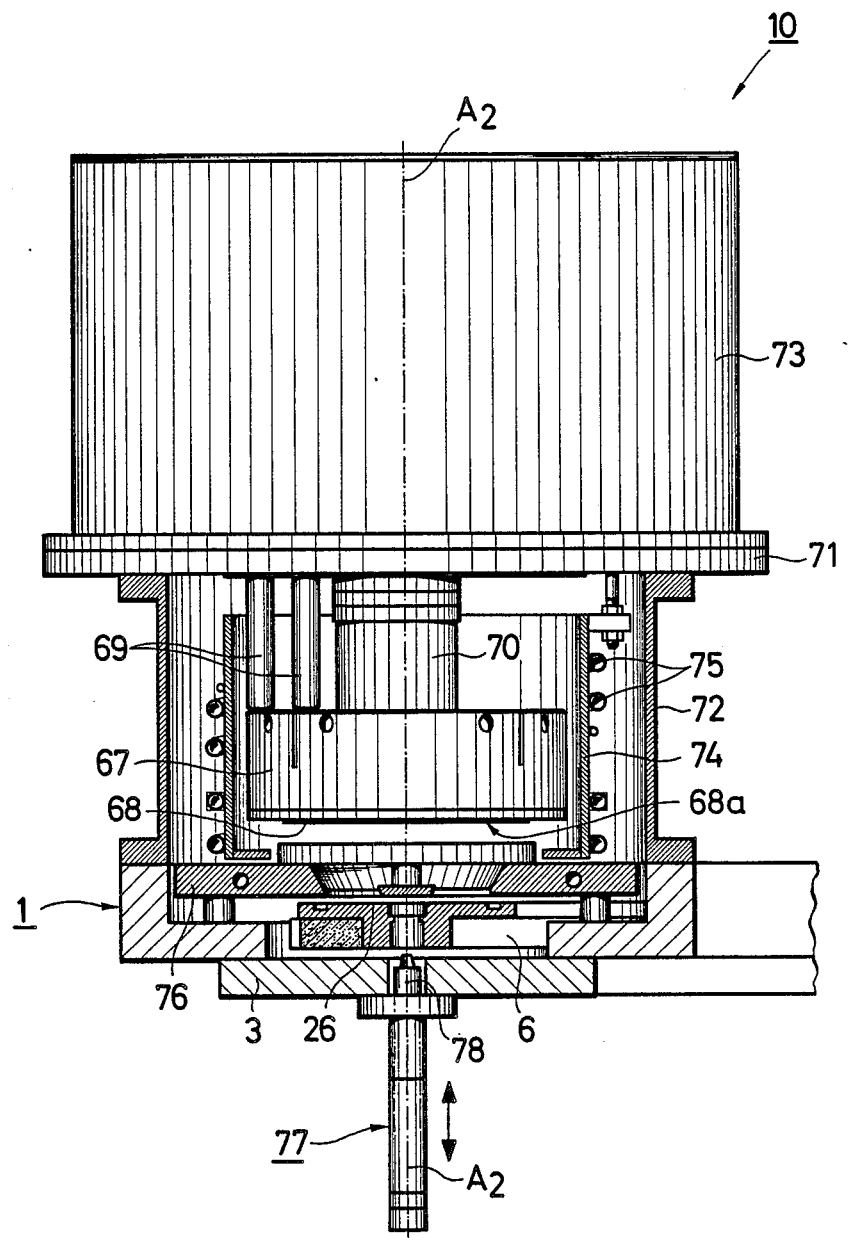
FIG. 4 is a partial vertical section through one of the coating stations.
Figure 5:
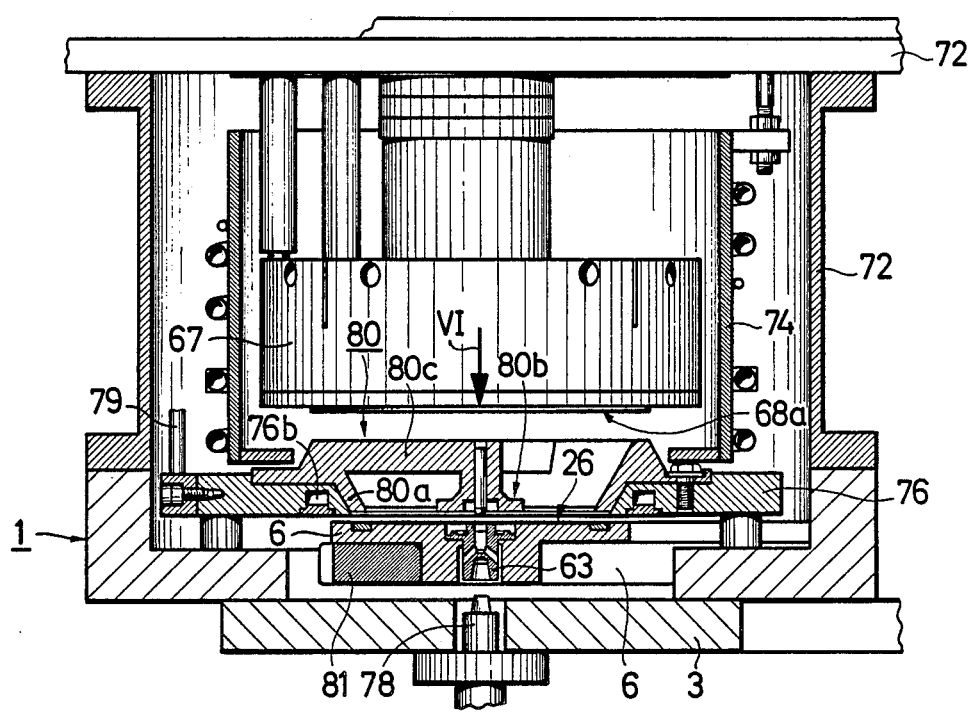
FIG. 5 is an enlarged detail of FIG. 4 showing additional details.
Figure 6:
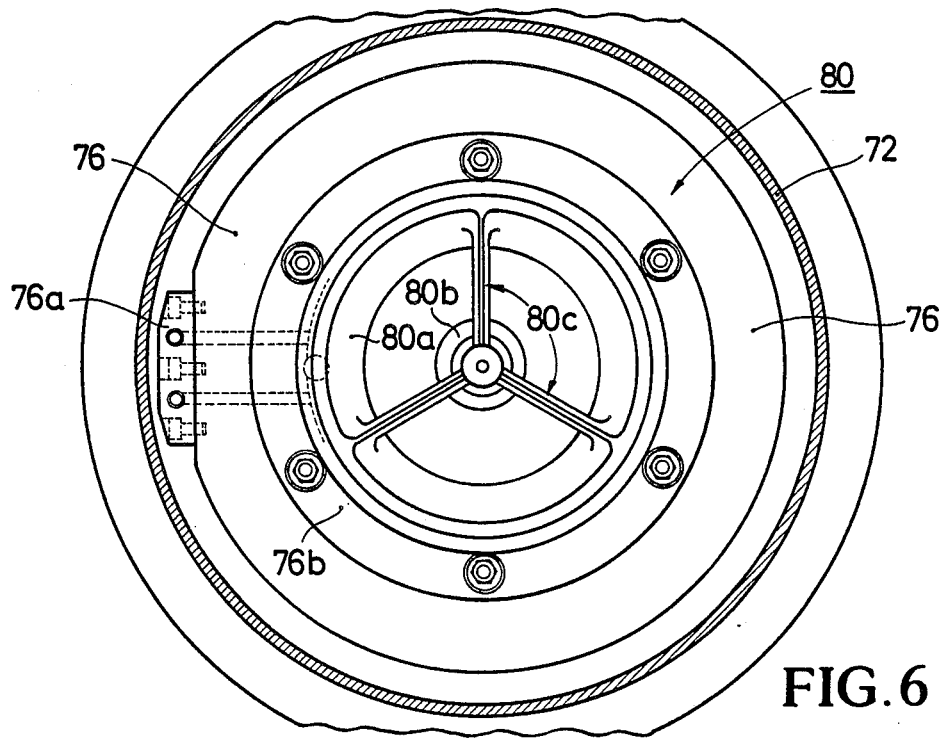
FIG. 6 is a top view of the bottom part of FIG. 5 as seen in the direction of the arrow VI.

FIGS. 4, 5 and 6 show all important details of a coating station 10 or 11. The essential element of such a coating station is a sputtering cathode 67 which is preferably in the form of a magnetron cathode and is obtainable commercially. Of this sputtering cathode essentially only the so-called dark space shielding is visible, as well as a so-called target 68 which extends out of the bottom face of the dark space shielding and with its sputtering surface 68a faces the substrate holder 6 and substrate 26, which is in the substrate holder 6 in the manner shown in FIG. 3.

The sputtering cathode 67 is connected by coolant lines 69 and a supporting column 70, which also contains the electrical feeder to the cathode, to a supporting flange 71 which is supported by a cathode chamber bottom part 72 on the vacuum chamber 1. On the supporting flange 71 furthermore rests a cathode chamber top part 73 in which the necessary lines etc. are housed.

Between the rotationally symmetrical sputtering cathode 67 and the cylindrical bottom part 72 is also a so-called inner chamber 74 which is surrounded by a cooling coil 75 and serves for carrying the sputtering gas in the vicinity of the cathode 67.

Between the sputtering surface 68a and the substrate 26 is also a mask holder 76 which will be further discussed in connection with FIGS. 5 and 6. The entire coating station is of a rotationally symmetrical configuration with respect to a vertical axis $A_2$—$A_2$, and underneath the chamber floor 3 there is an additional lifter 77, likewise coaxial with the axis $A_2$—$A_2$, which has a lifting rod 78 in a manner similar to FIG. 3. The arrangement is made such that the lifting rod 78 passes through the chamber floor 3 in a vacuum-tight manner.

The construction and the manner of the operation of the mask are now to be described with the aid of FIGS. 5 and 6. In the above-mentioned mask holder 76, which is equipped with a connecting element 76a for a cooling line 79 and with a concentric coolant passage 76b, a mask 80 is concentrically disposed, which consists of an outer mask 80a and of an inner mask 80b concentric therewith. The two mask parts are connected together by radially disposed, equidistantly arrayed spokes 80c. The outer mask 80a has a lower annular surface and the inner mask 80b has a bottom circular surface concentric therewith, which is disposed in the same plane as the bottom annular surface of the outer mask 80a. The spokes 80c are plainly set back upwardly from this plane. A soon as the substrate 26 has arrived at the position represented in FIG. 5, the substrate is lifted by means of the lifting rod 78 and the substrate pickup 63 and pressed against the bottom surfaces of the mask 80. As soon as this position of the substrate is reached, the sputtering cathode 67 is turned on, so that the annular surface of the substrate 26 that is not covered by the outer mask 80a and the inner mask 80b is coated with the material of the target 68 (or a reaction product of this target material). Due to the set-back of the spokes 80c, they do not produce any marked shadowing effect. The mask 80 is in any case effectively cooled by the mask holder 76, so that it is not damaged by the heat transferred in the coating process.

Figure 7:
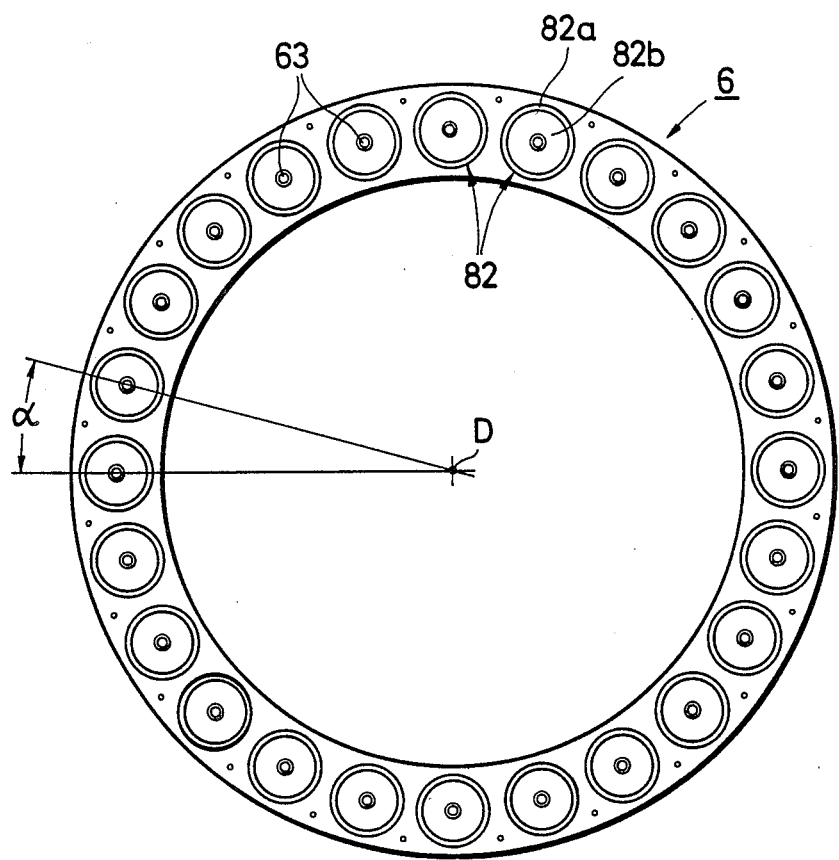
FIG. 7 is a plan view of the substrate holder.

From FIG. 5 it can also be seen that the substrate holder 6 has on its outer circumference a ring gear 81 which is engaged by a pinion, not shown here, of the motor 36 (FIG. 2). This substrate holder is furthermore shown in the plan view in FIG. 7: the substrate holder 6 according to FIG. 7 is of an annular configuration in plan, but in cross section it is somewhat T-shaped, as can be seen in FIGS. 3 and 4. In the top of the substrate holder 6, 24 shallow recesses 82 are located, with their axes lying on a circle, which have a circular outline of such a diameter that the substrates 26 can be laid flat in them with sufficient clearance. In the marginal area the recesses 82 have an annular groove 82a which surrounds a circular surface 82b. In the center of each recess 82 is a vertically movable substrate pickup 63 which is in the form of a rotational body and is represented in section in FIGS. 3 and 5. On account of the creation of a total of 24 recesses 82 and substrate pickups 63, the so-called pitch angle α with reference to the axis of rotation D of the system amounts to 15 degrees, it being understood that, in the case of a different number of recesses 82, this pitch angle may have correspondingly different values. It is according to this pitch angle α, however, that the step magnitude for the advancement of the substrate holder 6 is determined, as well as the arrangement of the air lock and coating stations. Thus, the spacing of the air lock stations 8 and 9 and the spacing of the coating stations 10 and 11 from one another is an odd multiple of the pitch angle α in the circumferential direction. Inasmuch as the step width of the drive 36 is twice as great as the pitch angle of the substrate pickups 63, the already-described two series of alternately arranged substrates are created. It is especially desirable for the two air lock stations 8 and 9 to be at an angular spacing of 3 pitch angles apart, and for the two coating stations 10 and 11 to have an angular distance of 5 pitch angles apart. Furthermore, between the last coating station 11 in the direction of transport, and the first air lock station 8 in the same direction, there is an angular spacing of five pitch angles. This brings it about that, between the last air lock station 9 in the direction of transport and the first coating station 10 in the direction of transport there is a correspondingly longer distance of eleven pitch angles, which is very useful for the preliminary treatment of the substrates. In this manner the two alternating series of substrates spend approximately the same amount of time in the vacuum. In the case, for example, of plastic substrates, such as those used in the manufacture of CD disks, this length of time provides for a sufficient outgassing. Furthermore it is possible to provide additional treatment stations along this relatively long course for any preliminary treatments of the substrates that may be necessary, such as for example stations for the plasma treatment of the substrates.

The manner of operation of the apparatus will once again be explained in this connection:

The substrate holder 6 is loaded by means of the two air lock stations 8 and 9 with substrates 26, and specifically the first, third, fifth, seventh etc. recess will be provided with a substrate by means of the air lock station 8, while by means of the air lock station 9 the second, fourth, sixth, eighth etc. recess 82 will be provided with a substrate. The substrates lying in the odd-numbered recesses form one series and those in the even-numbered recesses form another. The loading of the substrates is performed as follows: a gripper 22 takes a substrate from the corresponding transfer device 20 or 21 and after turning it about the axis 24 brings it to the position 26a represented in broken lines in FIG. 3. In this position of each substrate, the substrate pickup 63, raised by the lifting rod 62, enters with an annular projection from the bottom into a circular central hole in the substrate and holds it reliably tight. At this moment the gripper of the loading station releases the substrate, which now by a lowering movement of the lifting rod 62 is brought into the position 26 represented in solid lines in FIG. 3. Immediately after the substrate 26 comes to rest in the recess 82 of the substrate holder 6, the substrate pickup 63 also settles on the annular shoulder of the substrate holder 6, and the centering cone 64 separates from the substrate pickup 63. It is apparent that, in this case—unlike the way shown in FIG. 3— there is a seal between the substrate holder 6 and the air lock chamber upper part 38 on the one hand, and the air lock chamber bottom part 51 on the other. Immediately after the substrate 26 is lowered, the displacing body 44 is introduced into the interior space 39 above the substrate 26 (position represented in broken lines), resulting in a seal between the sealing surface 40a and the sealing edge 45. Then, with the vacuum pumps in constant operation, the air lock chamber upper part 38 is raised and the air lock chamber bottom part 51 is lowered. This position is represented in FIG. 3. Now the apparatus is in a state of operation in which the substrate holder 6 can be advanced one step, i.e., two pitch angles.

As soon as the substrate in question has come by its step-wise advance into the coating station 10 according to FIGS. 4 to 6 and there it has come to a stop, the substrate 26 is pressed by the lift rod 78 there present, upwardly against the mask 80, a process which has been described further above. In this pressed position the annular surface of the substrate 26 between the outer mask 80a and the inner mask 80b is coated with the material originating from the target 68. After the coating process has ended, the substrate 26 is brought back into the lower position within the recess 82, while the lifting rod 78 also separates from the substrate pickup 83 (FIGS. 4 and 5). It is now once again possible to advance the substrate holder 6 step-wise until the finish coated substrate comes back into the same air lock station 8. The exit of the substrate through the air lock is the precise opposite of its entrance, i.e., first the substrate holder 6 is sealed against the air lock chamber upper part 38 and the air lock chamber lower part 51, then the interior 39 is flooded, and the displacing body 44 is raised up. Immediately thereafter the substrate 26 is also lifted by the lifting rod 62 to the position 26a indicated by the dash-dotted lines, and gripped by one of the grippers 22 or 23, and rotated around the axis $A_1$—$A_1$ out of the area. Immediately thereafter again, a fresh, uncoated substrate is swung by the rotation of the grippers around the axis of rotation 24 into the same position, whereupon the entry through the air lock is repeated in the manner described above.

We claim:

1. Apparatus according to the carousel principle for the coating of substrates, with a vacuum chamber and a rotatable substrate holder disposed therein, which has in equidistant distribution and in circular arrangement a plurality of substrate pickups, adjacent pickups being angularly separated by a pitch angle, said holder being and is transportable step-wise by means of a drive on a circular path from an air lock station through at least one coating station to an air lock station, characterized in that the vacuum chamber (1) has, in the circumferential direction of the rotatable substrate holder (6), two air lock stations (8, 9) and two coating stations (10, 11), one behind the other in each case, and that the stepping width of the drive (36) on the one hand, and, on the other hand, the angular position of each coating station (10 and 11, respectively) to the air lock station (8 or 9, respectively) associated with it, are selected in reference to the axis of rotation of the substrate holder (6) such that one and the same coating station (10 and 11, respectively) is associated, via the step-wise movement of a particular substrate pickup (63), with one and the same air lock station (8 and 9, respectively).

2. Apparatus according to claim 1, characterized in that the substrates coated in the coating station (10) that is foremost in the direction of transport can enter and exit through a lock in the air lock station (8) that is likewise foremost in the direction of transport, and the substrates coated in the coating station (11) that is hindermost in the direction of transport can enter and exit through a lock in the air lock station (9) that is hindermost in each case.

3. Apparatus according to claim 1, characterized in that the step size of the drive (36) is twice as great as the pitch angle for the substrate pickups.

4. Apparatus according to claim 3, characterized in that the spacing apart of the air lock stations (8, 9) in the circumferential direction is an odd multiple of the pitch angle.

5. Apparatus according to claim 3, characterized in that the spacing apart of the coating stations (10, 11) in the circumferential direction is an odd multiple of the pitch angle.

6. Apparatus according to claim 1, characterized in that the two air lock stations (8, 9) have an angular distance apart of three pitch angles.

7. Apparatus according to claim 1, characterized in that the two coating stations (10, 11) have an angular distance apart of five pitch angles.

8. Apparatus according to claim 1, characterized in that, between the coating station (11) that is last in the direction of transport and the first air lock station (8) in the direction of transport, there is an angular spacing of five pitch angles.

9. Apparatus according to claim 1, characterized in that with each air lock station (8, 9) there is associated one loading station (16, 17) and one magazine station (18, 19), that between each loading station and each magazine station there is disposed one transfer means (20, 21) with two parallel one-way transport paths (20a, 20b; 21a, 21b).

10. Apparatus according to claim 9, characterized in that each loading station (16, 17) has two grippers (22, 23) which are fastened in diametrically opposite directions on a common axis of rotation (24) which is disposed in such a position to the transfer means (20, 21) on the one hand and to the air lock station (9, 8) on the other that, by means of the one gripper (23), a substrate situated over the air lock station (8, 9) can be selectively grasped or deposited, and simultaneously, by means of the other gripper (22), a substrate (26b) situated over the transfer means can be selectively gripped or released.

11. Apparatus according to claim 1, characterized in that the air lock station (8, 9) has an air lock chamber upper part (38) which is movable in the vertical direction while sealed from the vacuum chamber (1) and has a horizontal upper and bottom sealing surface (40a, 40b), plus a driven displacing body (44) associated with the upper part (38) and largely filling its interior (39), with a circumferential sealing margin (45) situated on its upper edge and placeable on the upper sealing surface (40a) of the upper part, and also a drive by which the bottom sealing surface (40b) of the upper part can subsequently be placed sealingly on the upper side of the substrate holder, and furthermore a coaxial air lock chamber bottom part (51) which is movable in the vertical direction while being sealed from the vacuum chamber and is coaxial with the upper part (38), and which is pressable sealingly against the bottom of the substrate holder (6) such that, with the displacing body raised, the space between the substrate holder (6) and the vacuum chamber is sealed against the ambient air, but when the displacing body (44) is lowered and the air lock chamber evacuated the substrate holder is freely movable against the sealing surfaces.

12. Apparatus according to claim 11, characterized in that the substrate pickups (63) are of rotationally symmetrical configuration and mounted for vertical movement in the substrate holder (6), and can be raised and lowered by lift rods (62, 78) together with the substrates (26).

13. Apparatus according to claim 11, characterized in that, in the air lock chamber bottom part (51), coaxial with the latter, a lift rod (62) is disposed for the substrate pickup (63) that is situated in the air lock station (8).

14. Apparatus according to claim 1, characterized in that the coating station (10, 11) has a cathode chamber (77, 73) disposed on the vacuum chamber (1), with a sputtering cathode (67) with a target (68), whose sputtering surface (68a) faces the substrate holder (6), that between the target and the substrate holder a mask holder (76) with a mask (80) is disposed, and that underneath the vacuum chamber (1) a lifting means (77) is disposed, with a lift rod (78) sealingly penetrating the chamber floor (3), by which the substrate (26) can be pressed by means of the substrate pickup concentrically against the mask (80).

* * * * *